US010068772B2

(12) United States Patent
Wang

(10) Patent No.: US 10,068,772 B2
(45) Date of Patent: Sep. 4, 2018

(54) RECESS CHANNEL SEMICONDUCTOR NON-VOLATILE MEMORY DEVICE AND FABRICATING THE SAME

(71) Applicant: FlashSilicon Incorporation, Diamond Bar, CA (US)

(72) Inventor: Lee Wang, Diamond Bar, CA (US)

(73) Assignee: Flashsilicon Incorporation, Diamond Bar, CA (US)

( * ) Notice: Subject to any disclaimer, the term of this patent is extended or adjusted under 35 U.S.C. 154(b) by 0 days.

(21) Appl. No.: 14/815,257

(22) Filed: Jul. 31, 2015

(65) Prior Publication Data

US 2017/0033116 A1    Feb. 2, 2017

(51) Int. Cl.
| | |
|---|---|
| *H01L 29/66* | (2006.01) |
| *H01L 21/28* | (2006.01) |
| *H01L 29/423* | (2006.01) |
| *H01L 29/78* | (2006.01) |
| *H01L 27/11521* | (2017.01) |

(52) U.S. Cl.
CPC .. *H01L 21/28273* (2013.01); *H01L 27/11521* (2013.01); *H01L 29/42336* (2013.01); *H01L 29/66348* (2013.01); *H01L 29/7813* (2013.01)

(58) Field of Classification Search
CPC ......... H01L 21/28273; H01L 29/42336; H01L 29/7813; H01L 27/11521
See application file for complete search history.

(56) References Cited

U.S. PATENT DOCUMENTS

| | | | |
|---|---|---|---|
| 7,164,170 B2 | 1/2007 | Kim | |
| 7,378,312 B2 | 5/2008 | Kim | |
| 8,268,690 B2 | 9/2012 | Kim | |
| 2007/0001213 A1* | 1/2007 | Om | H01L 27/115 257/315 |
| 2007/0122968 A1* | 5/2007 | Sim | H01L 21/28273 438/243 |
| 2008/0121990 A1* | 5/2008 | Hasunuma | H01L 27/10876 257/333 |
| 2014/0097483 A1* | 4/2014 | Wang | H01L 27/1156 257/318 |

* cited by examiner

*Primary Examiner* — Su C Kim
(74) *Attorney, Agent, or Firm* — Muncy, Geissler, Olds & Lowe, P.C.

(57) ABSTRACT

A recess channel semiconductor non-volatile memory (NVM) device is disclosed. The recess channel MOSFET devices by etching into the silicon substrate for the device channel have been applied to advanced DRAM process nodes. The same etching process of the recess channel MOSFET device is applied to form the recess channel semiconductor NVM device. The tunneling oxides are grown on silicon surface after the recess channel hole etching process. The storing material is deposited into the recess channel holes with coupling dielectrics on top of the storing material. The gate material is then deposited and etched to form the control gate. Owing to the recess channel embedded below the silicon substrate, the scaling challenges such as gate channel length, floating gate interference, high aspect ratio for gate stack etching, and the mechanical stability of gate formation for the semiconductor NVM device can be significantly reduced.

14 Claims, 23 Drawing Sheets

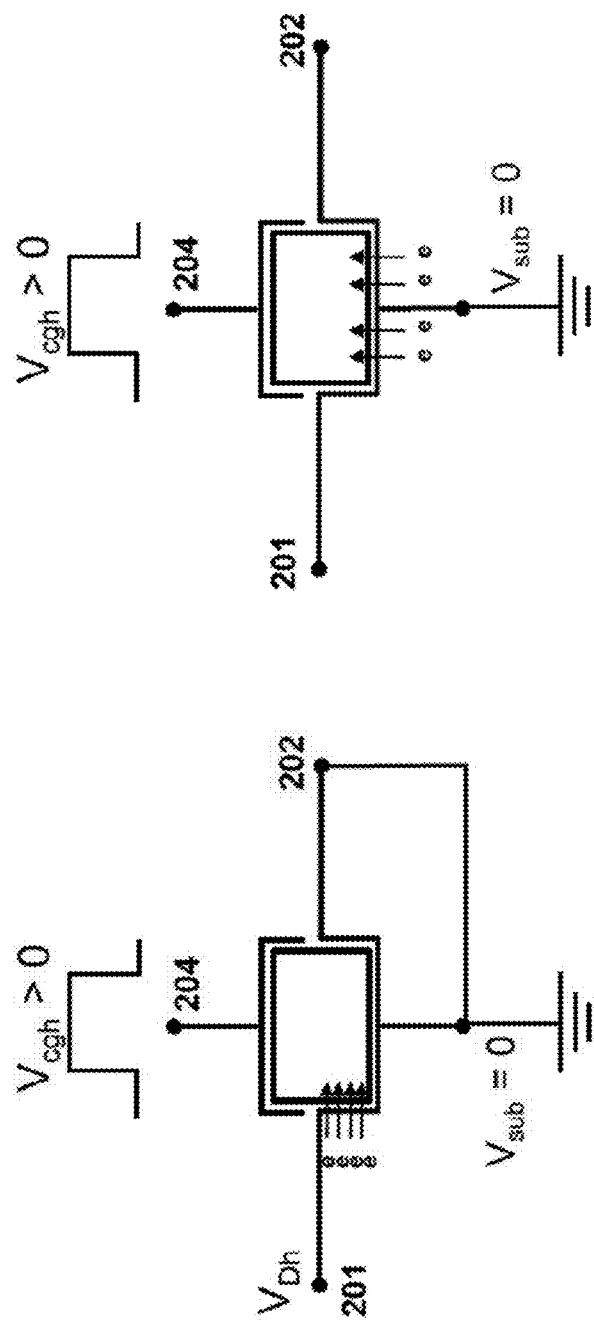

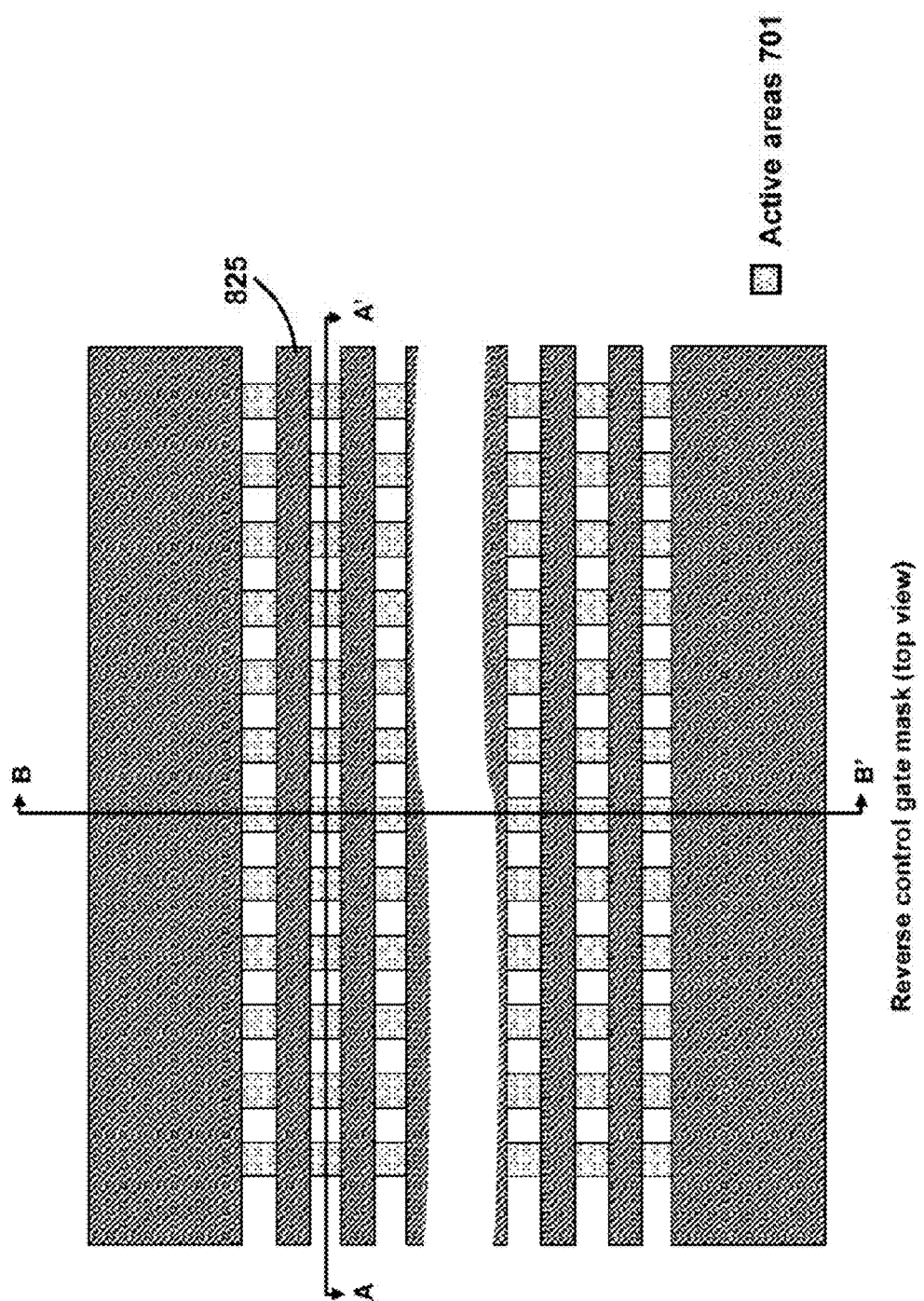

BB'

AA'

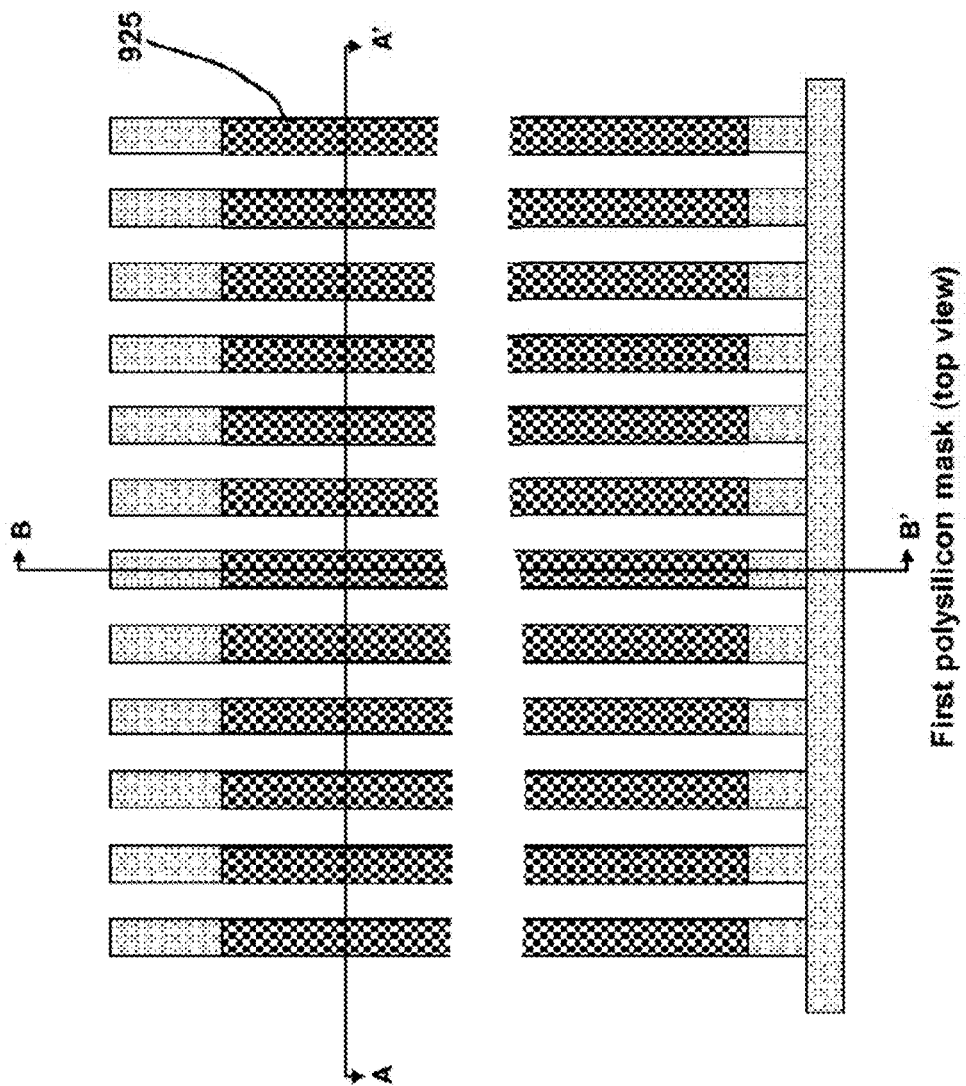

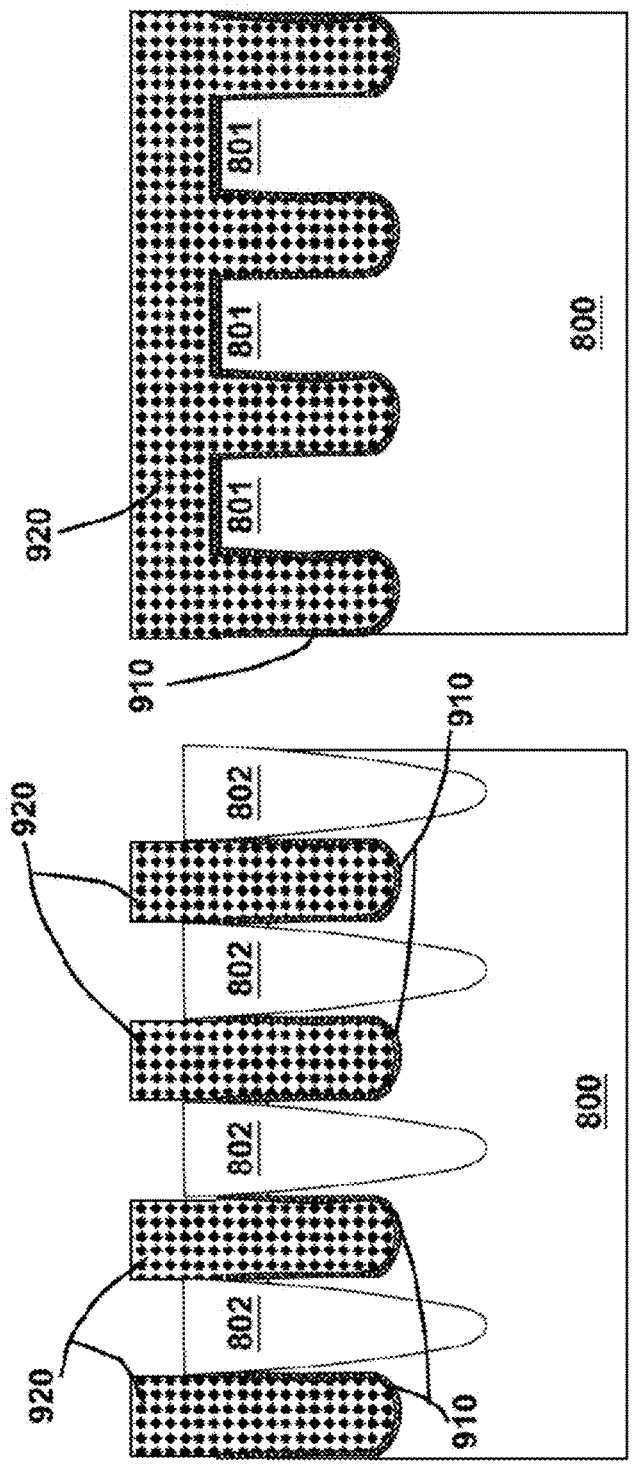

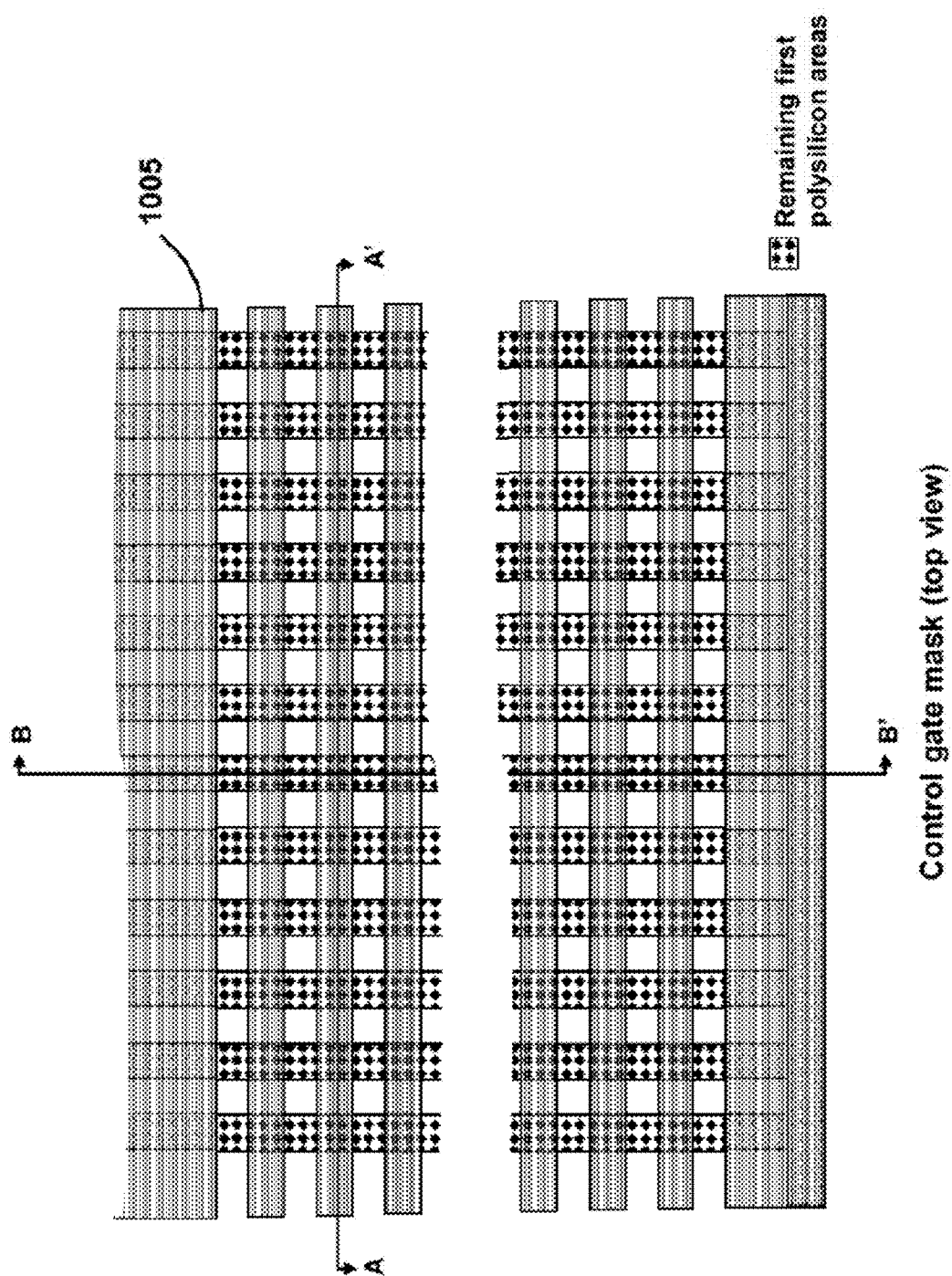

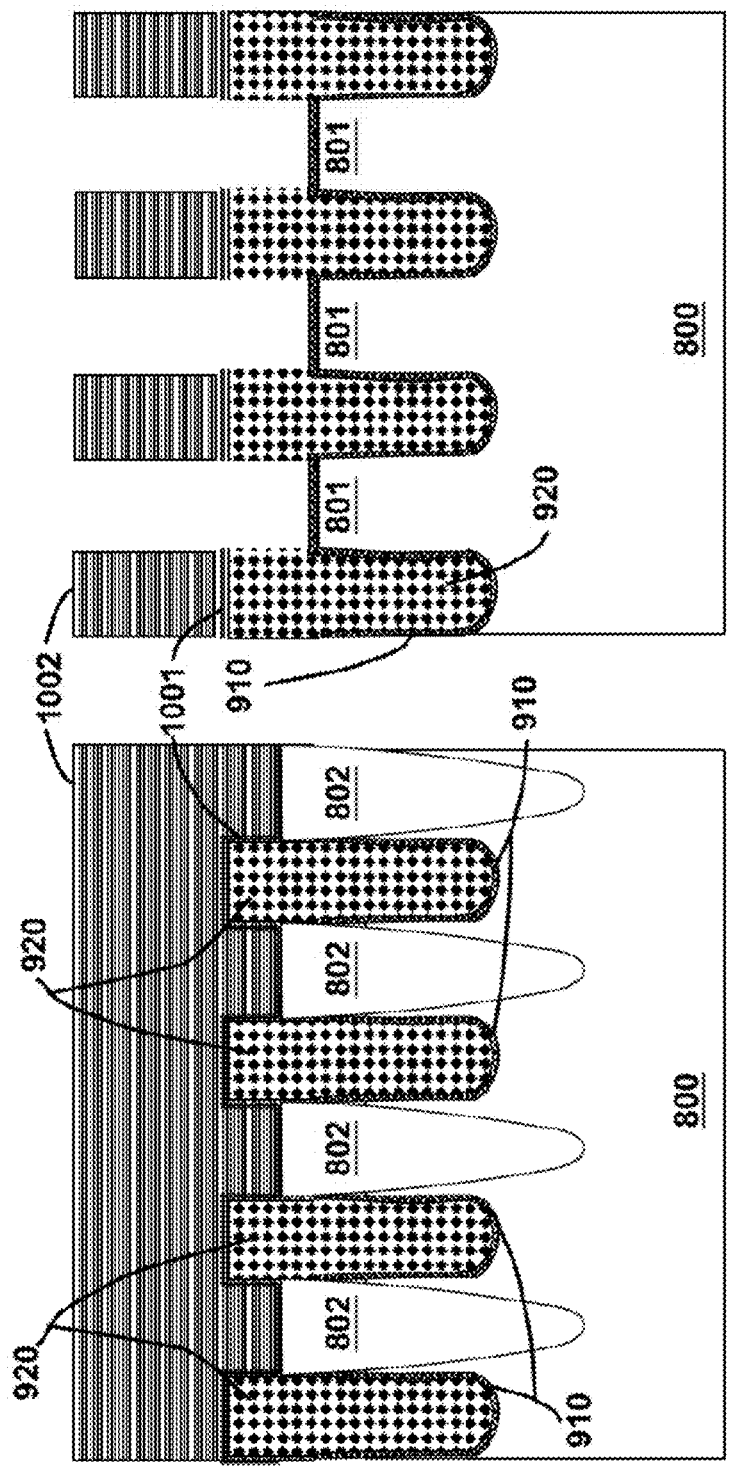

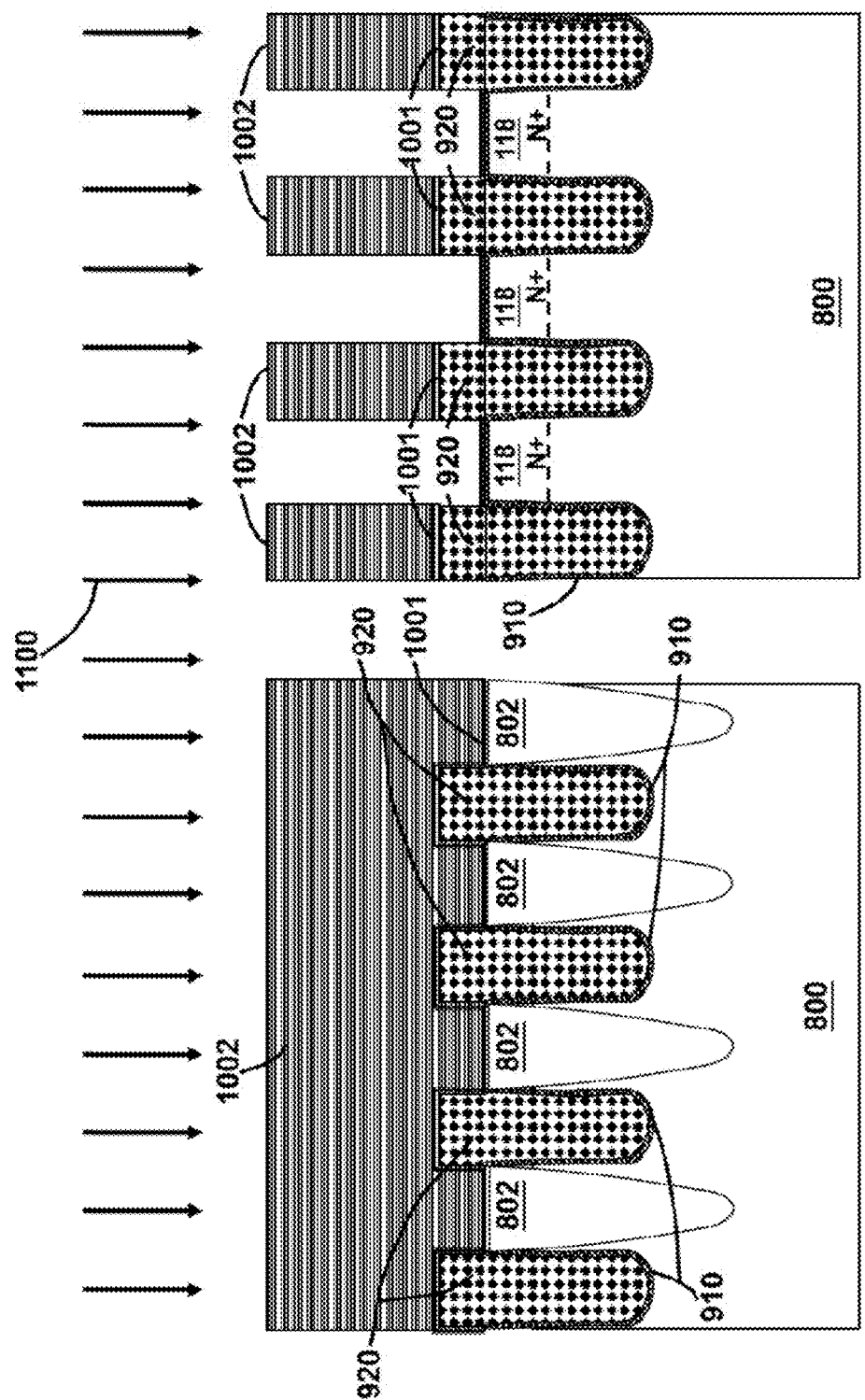

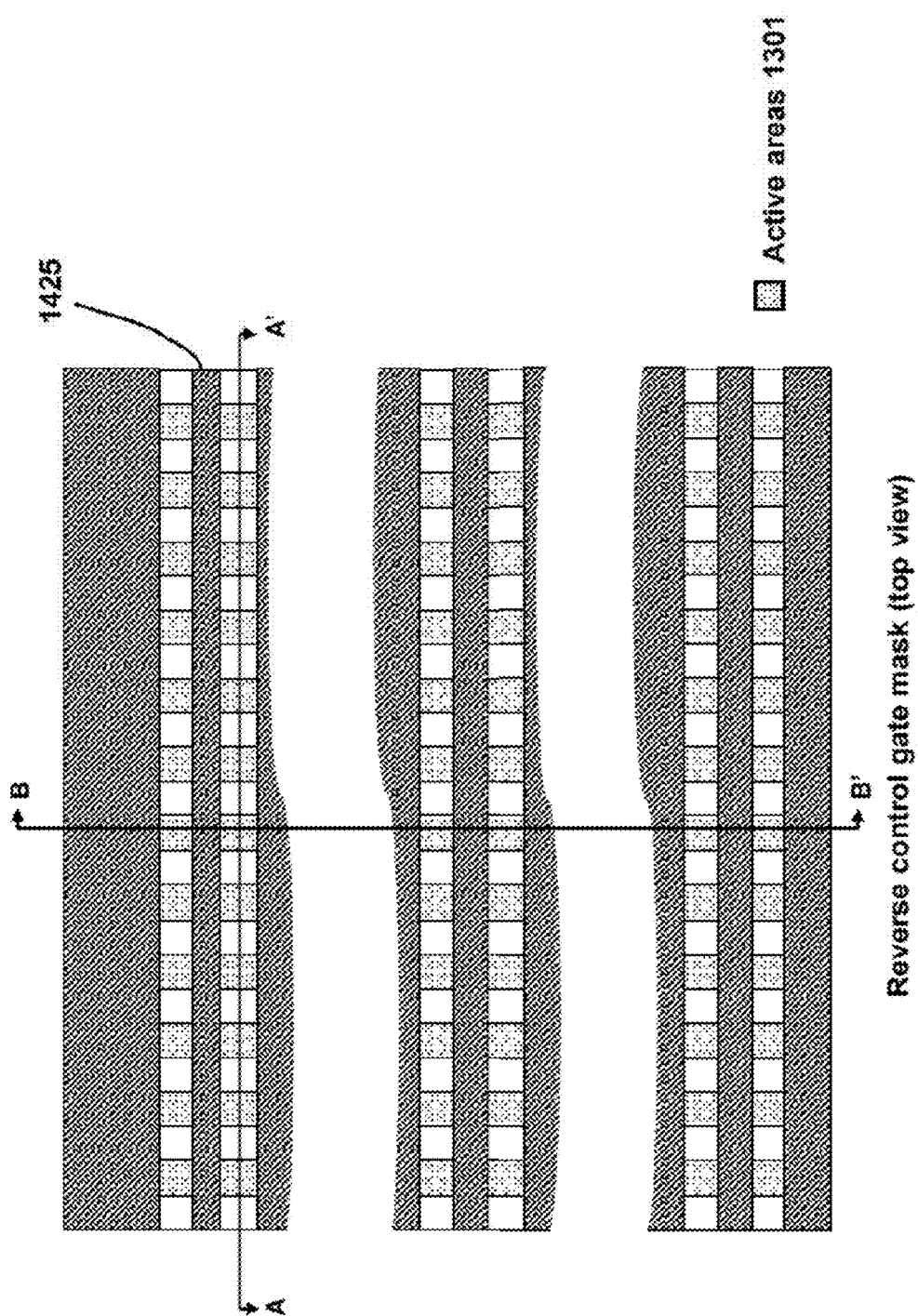

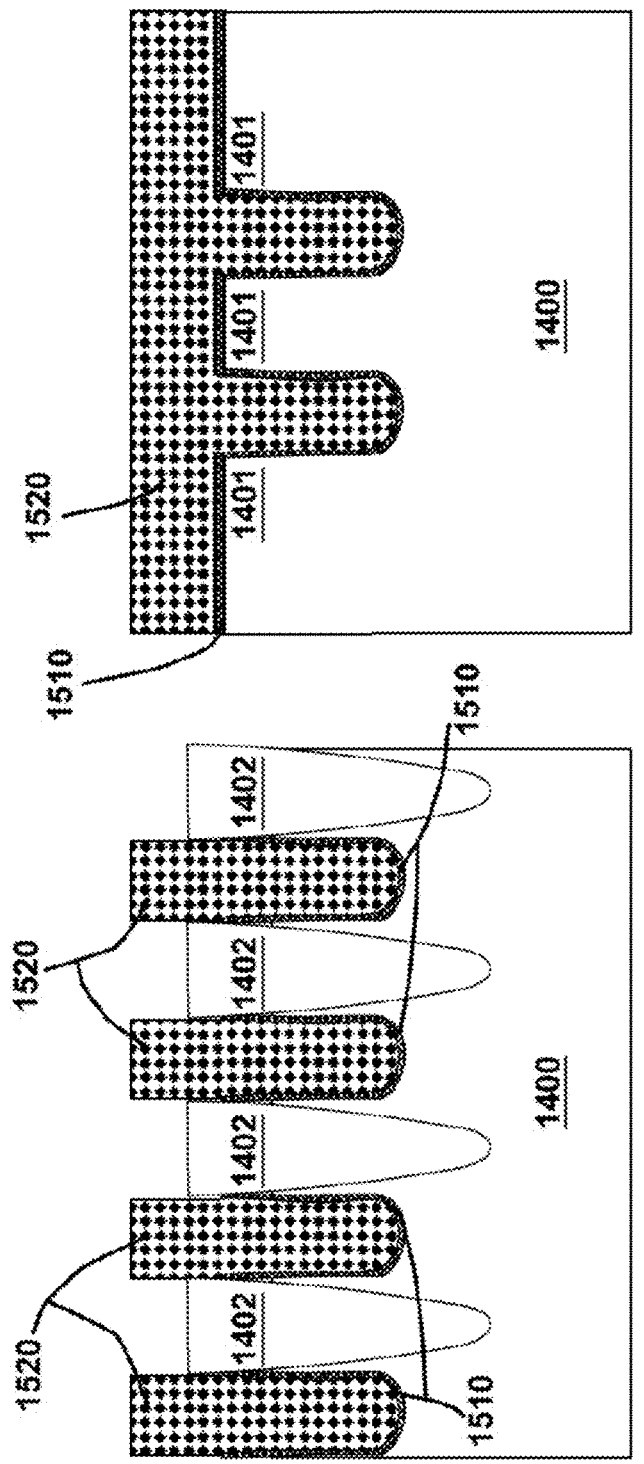

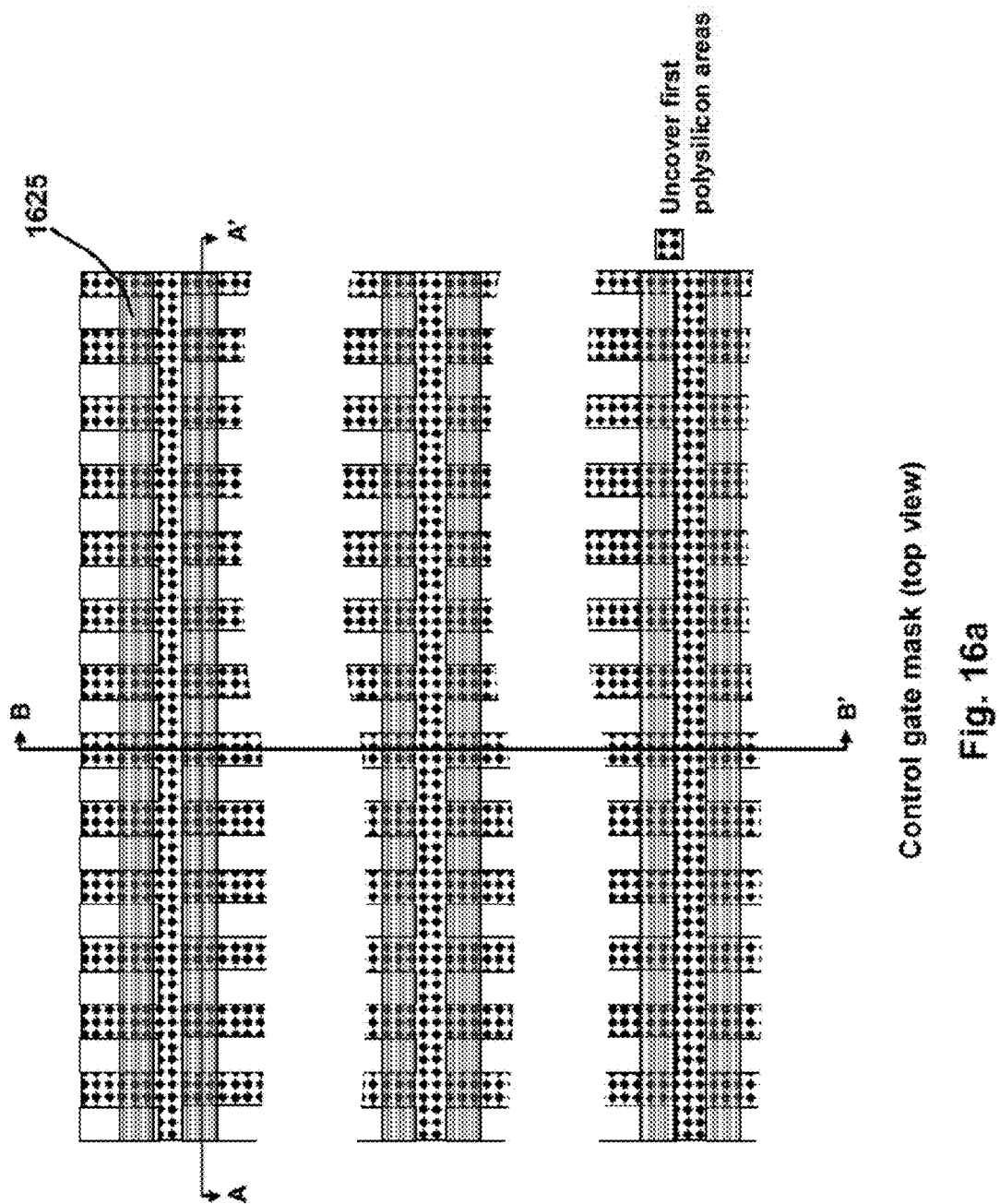

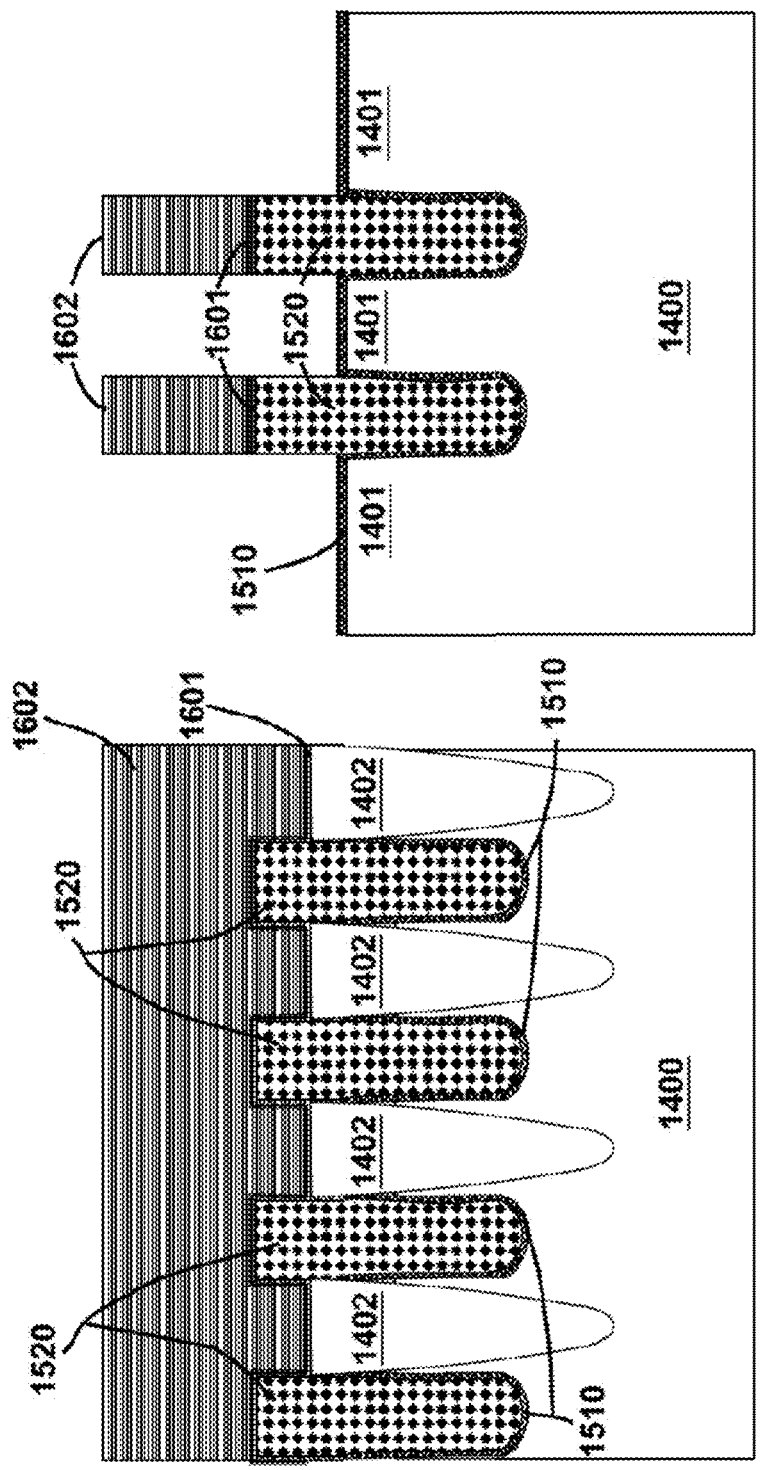

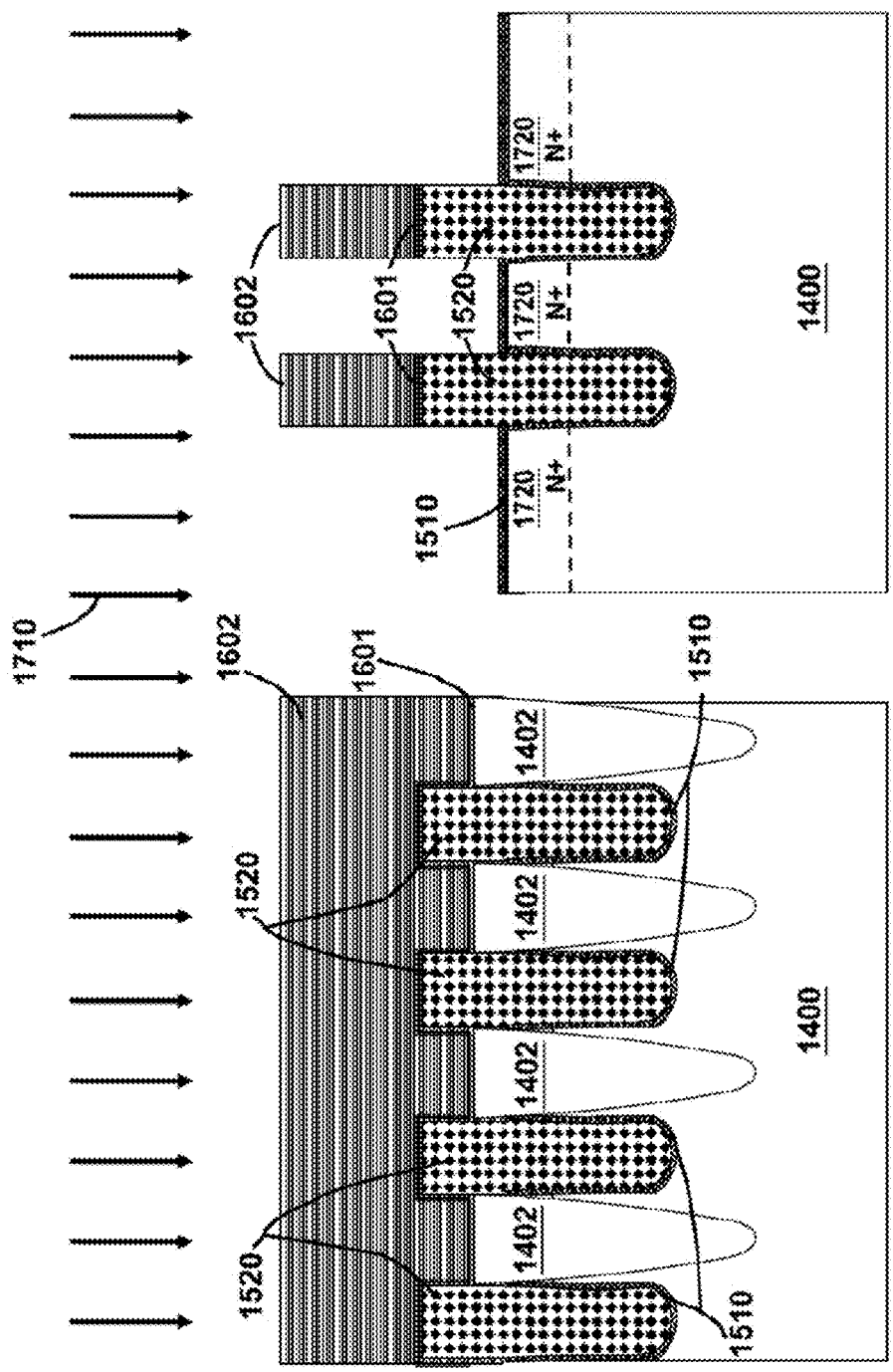

RECESS CHANNEL SEMICONDUCTOR NON-VOLATILE MEMORY DEVICE AND FABRICATING THE SAME

BACKGROUND OF THE INVENTION

Field of the Invention

The invention relates to a semiconductor Non-Volatile Memory (NVM) device and methods of fabrication. In particular, the channel of the semiconductor NVM device is recessed in silicon substrate surfaces.

Description of the Related Art

Semiconductor Non-Volatile Memory (NVM), and particularly Electrically Erasable, Programmable Read-Only Memories (EEPROM), exhibits wide spread applicability in a range of electronic equipment from computers, to telecommunications hardware, to consumer appliances. In general, EEPROM serves a niche in the NVM space as a mechanism for storing firmware and data that can be kept even with power off and can be altered as needed. The flash EEPROM may be regarded as a specifically configured EEPROM that may be erased only on a global or sector-by-sector basis.

EEPROM flash is categorized into NOR-type flash and NAND-type flash according to its device cell array configuration. Usually, the cell sizes of NOR-type flash and NAND-type flash are 9~10 $F^2$ and 4~5 $F^2$, respectively, where F is the feature size for a process technology node. With the advanced process technology, the minimal process features have been scaled to around 20 nm nodes and below. Continuously scaling down semiconductor NVM cell device below 20 nm node poses significant challenges in cell device design and process technology. Those challenges include device short channel length, floating gate cell-to-cell interference, high aspect ratio for the gate formation process and the after-etched gate stack stability from collapsing.

To resolve the similar short channel length issue for scaling down DRAM (Dynamic Random Access Memory), recess gate transistor structures have been successfully applied to DRAM cells, such as U.S. Pat. Nos. 7,164,170, 7,378,312, and 8,268,690 (the disclosures of which are incorporated herein by reference in their entirety). For the cross-section view illustrated in FIG. 1, the recess channels 111a and 111b of paired access transistors 110a and 110b are formed along the bottom of recess surfaces in silicon substrate with N-type common source/drain regions 104c, 104a and 104b on or above the silicon substrate. The P-type impurity profiles in the P-type silicon substrate are channel region 102, well region 101, and substrate intrinsic region 100. The gate material is then deposited into the recess region on top of the grown oxides 105 on the silicon surface to form the transistor gate 106. The pairs of access transistors 110a and 110b in a memory array are isolated by the shallow trench isolations 103 in the silicon substrate. The channel lengths of the access transistors 110a and 110b thus increase for the recess channels 111a and 111b in comparison with the gate lengths of the conventional planar transistors processed with the same minimal feature node as shown in FIG. 1. The application of the recess channel for the access transistors in DRAM has greatly improved the charge retention time for the storage capacitors by reducing the "off-state" leakage currents of the access transistors, and can extend the DRAM process scalability down to the 20 nm nodes. On the other hand, the semiconductor non-volatile memory scaling issues such as channel length, floating-gate interference, and high aspect etch ratios can be resolved by applying the floating-gate recess channel transistor as well.

First, like the access transistors 110a and 110b in advanced DRAM technology nodes, the floating-gate recess channel transistor gains its channel length by recessing the channel in the silicon substrate. Second, instead of exposing the floating-gates on the silicon surface, the floating-gate is embedded inside the ground potential silicon substrate and the cell-to-cell threshold voltage interference between floating-gates is also minimized. Third, by recessing the floating-gate accordingly with the recessed channel of the semiconductor NVM device in the silicon substrate, the high aspect gate etching ratio for the tunneling dielectrics/poly-silicon/coupling dielectrics/metal film stack is thus relieved. Meanwhile the holding strength of the tall slim-shape gate is also increased due to the gate film stack anchored inside the silicon substrate.

SUMMARY OF THE INVENTION

The schematic of the recess channel semiconductor NVM device 200 is shown in FIG. 2. The source and drain electrodes 201 and 202 are above the device channel 205. The charge store materials 203 are embedded on top of the tunneling dielectric 206 along the recess channel 205 of the semiconductor NVM device 200. The charge storing materials 203 for storing non-volatile charges could be a piece of conducting floating gate such as poly-silicon or metals, charge trap material such as nitride or hafnium oxide, or nano-particles embedded in oxides. The control gate 204 is wrapped along the coupling dielectrics 207 deposited on the surfaces of the charge storing material 203. After process completion, the semiconductor NVM device forms Metal Oxide Semiconductor Field Effect Transistor (MOSFET) with charge storing material in between the control gate and the recess channel. When a voltage is applied to the control gate 204, the applied electric field is transmitted into the recess channel 205 through the capacitive coupling of the charge storing material 203. Assuming no extra charges in the floating gate 303 as the equivalent circuit of the series-capacitors for the conducting floating gate NVM device 300 shown in FIG. 3, the voltage potential at the conducting floating gate 303 is given by $V_f = V_{cg} \times C_c / (C_c + C_{mos})$, where $C_c$ is the capacitance between control gate 304 and floating gate 303, $C_{mos}$ is the capacitance between floating gate 303 and MOSFET channel 305, and $V_{cg}$ is the applied control gate voltage. The recess channel of the semiconductor NVM devices 300 can be inverted with the floating gate voltage potential $V_f$ higher than the threshold voltages of the floating-gate recess channel MOSFET device 310 as for the similar switching characteristics of the recess channel MOSFET devices in DRAM. The floating gate voltage potential above and below the threshold voltage of the floating-gate recess channel MOSFET device 310 can then respectively turn "on" and "off" the recess channel NVM device 300 by the capacitive coupling of the applying control gate voltage. Thus, the source-drain current characteristics versus the control gate voltage for the recess channel floating gate NVM device 300 is determined by the control gate-floating gate voltage relation of $V_f = V_{cg} \times C_c / (C_c + C_{mos})$ and by the floating gate voltage $V_f$ in substitution for the gate voltage of the floating-gate recess channel MOSFET device 310.

By the charge conservation law between device's channel and gate(s), the threshold voltages of the recess channel NVM devices 200 shift toward more positive for negative charged electrons injected into the charge storing material of the recess channel NVM devices 200. While the threshold voltages of the recess channel NVM devices 200 shift to lower threshold voltages for electrons removed from the storing material or injected with positive charged holes. For the ideal conducting floating gate 303 of semiconductor NVM devices 300 as the equivalent series-capacitor circuitry of FIG. 3, the threshold voltage shift from the recess channel NVM device's intrinsic threshold voltage $V_{thin}$, defined as the threshold voltage with no net charges in the floating-gate 303 (electrically neutral), is given by $\Delta V_{th} = -Q/C_c$, where Q is the amount of net charges stored in the conducting floating gate 303. The intrinsic threshold voltage $V_{thin}$ of a recess channel semiconductor NVM device 300 can be physically obtained by measuring its threshold voltage after exposing the device to ultra-violet lights for releasing extra residual charges (electrons and holes) trapped inside the floating gate 303 and the channel dielectrics (not shown). The electrical characteristics of the recess channel NVM devices after programming/erase are exactly parallel shifted from its intrinsic threshold voltage $V_{thin}$ with the threshold voltages given by $V_{th} = V_{thin} + \Delta V_{th}$, for that the very slight charges trapped inside the channel dielectric after programming operations or erase operations are negligible. For the applications of the recess channel semiconductor NVM 200, the threshold voltage states of the recess channel NVM devices 200 can be assigned to represent digital data. For example, the high threshold voltage state of the recess channel NVM devices 200 represents a digital value "0" and the low threshold voltage state of the recess channel NVM devices 200 represents a digital value "1", respectively. The threshold voltage states of a recess channel NVM device 200 can be identified by applying a control gate voltage to interrogate the recess channel NVM device 200 for its responsive on/off currents. The charges in the storing material of the recess channel NVM device for altering the device threshold voltage are also required to retain at least for ten years without refreshing such that the threshold voltages of the NVM devices only vary insignificantly during the operational lifetime. That is, for its operational lifetime the stored data represented by the threshold voltages of the recess channel NVM devices 200 are non-volatile.

Programming a recess channel semiconductor NVM device 200 is to inject electrons into the charge storing material of the recess channel semiconductor NVM device 200. It is well-known in the arts that Channel Hot Electron Injection (CHEI) illustrated in FIG. 4a and Fowler-Nordheim (FN) tunneling illustrated in FIG. 4b are the two major programming methods for semiconductor NVM devices 200. Band-to-band hot-electron injection is also applied to P-type NVM device for programming. The erase operation is either to remove electrons from the storing material or slight injection of holes into the storing material for the recess channel semiconductor NVM device. Fowler-Nordheim (FN) tunneling illustrated in FIG. 5a and band-to-band hot-hole injection illustrated in FIG. 5b are the two main schemes to remove or to annihilate electrons in the storing material of semiconductor NVM devices 200. Based on the same physical principles of the MOSFET operational mechanisms, the programming and erase schemes for the planar semiconductor NVM can be also applied to the recess channel semiconductor NVM 200 of the invention.

BRIEF DESCRIPTION OF THE DRAWINGS

For a better understanding of the present invention and to show how it may be carried into effect, reference will now be made to the following drawings, which show the preferred embodiments of the present invention, in which:

FIGS. 4a and 4b respectively illustrate two programming methods, hot electron injection and Fowler-Nordheim tunneling, for the recess channel NVM devices in FIG. 2.

FIG. 8a shows a reverse control gate mask for recess channel hole etch process for NAND-type array of FIG. 6.

FIG. 9a shows a first polysilicon mask for NAND-type array of FIG. 6.

FIGS. 9b and 9c show the cross section views for line AA' and line BB' (as the locations indicated in FIG. 7) after first polysilicon etch process for NAND-type array of FIG. 6.

FIG. 10a shows a control gate mask for NAND-type array of FIG. 6

FIGS. 10b and 10c show the cross section views for line AA' and line BB' (as the locations indicated in FIG. 7) after control gate etch process for NAND-type array of FIG. 6.

FIGS. 11a and 11b illustrate N-type impurities ion implantation to form the source/drain electrodes for NAND-type array of FIG. 6.

FIG. 14a shows a reverse control gate mask for recess channel hole etch process for NOR-type array of FIG. 13.

FIGS. 15b and 15c show the cross section views for line AA' and line BB' (as the locations indicated in FIG. 13) after first polysilicon etch process for NOR-type array of FIG. 12.

FIG. 16a shows a control gate mask for NOR-type array of FIG. 13.

FIGS. 16b and 16c show the cross section views for line AA' and line BB' (as the locations indicated in FIG. 13) after control gate etch process for NOR-type array of FIG. 12.

FIGS. 17a and 17b illustrate N-type impurities ion implantation to form the source/drain electrodes for NOR-type array of FIG. 12.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
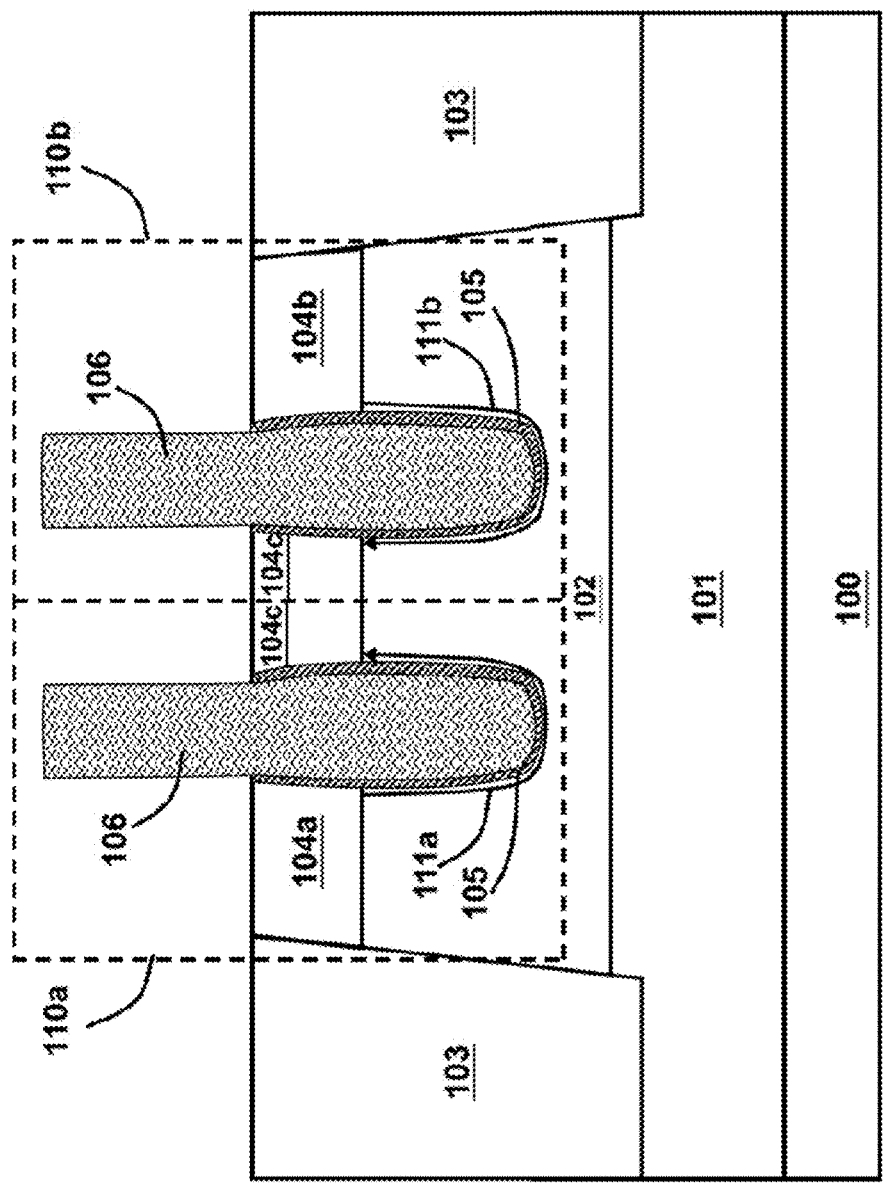
FIG. 1 illustrates the cross-section view of conventional recess channel transistors used for access transistors in DRAM memory cells.
Figure 2:
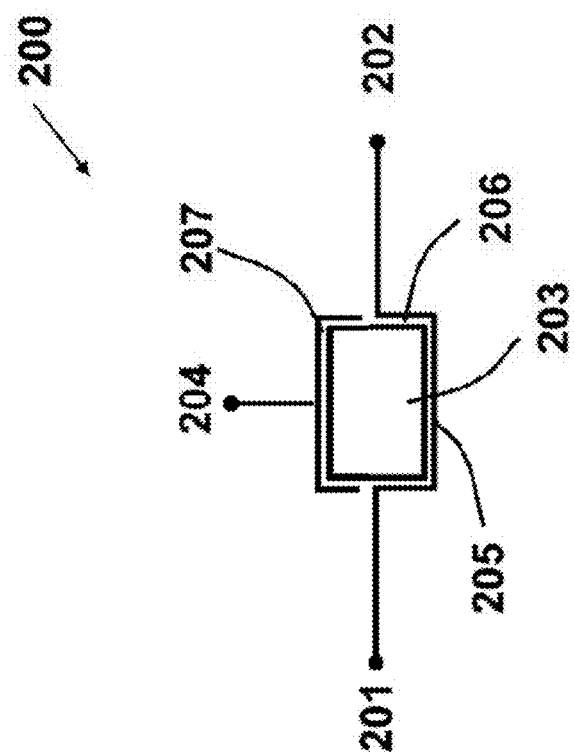
FIG. 2 shows the schematic of the recess channel semiconductor non-volatile memory device according to the invention.
Figure 3:
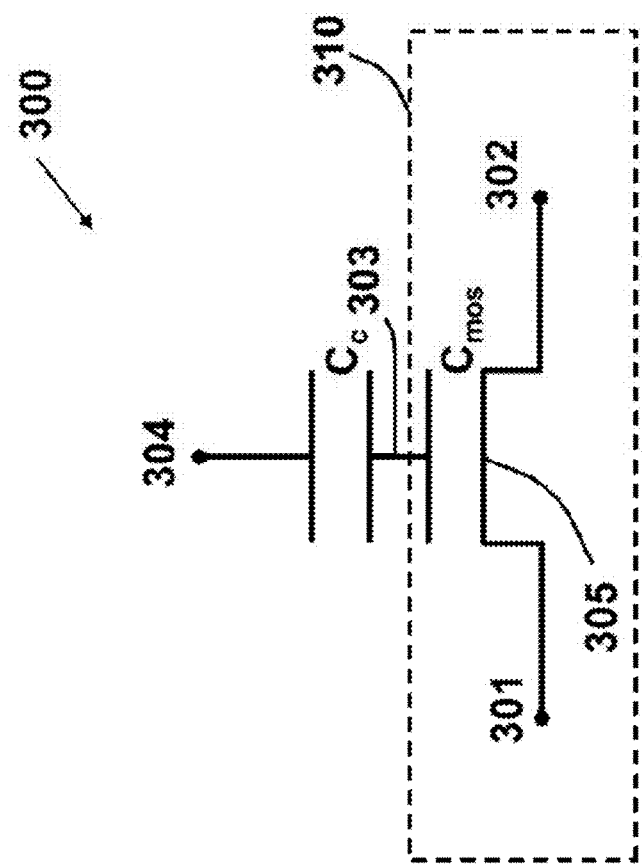
FIG. 3 shows the equivalent circuit schematic for a floating gate type of recess channel NVM device according to an embodiment of the invention.
Figure 5B:
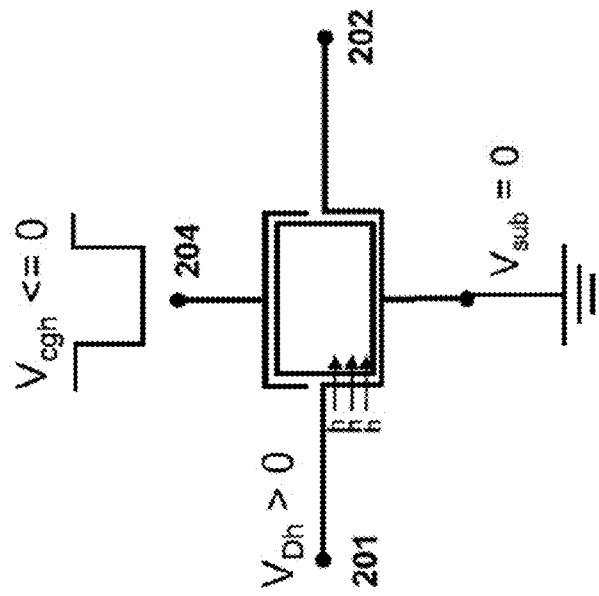
FIGS. 5a and 5b respectively illustrate two erase methods, Fowler-Nordheim tunneling and band-to-band hot-hole injection, for the recess channel NVM device in FIG. 2.
Figure 5A:
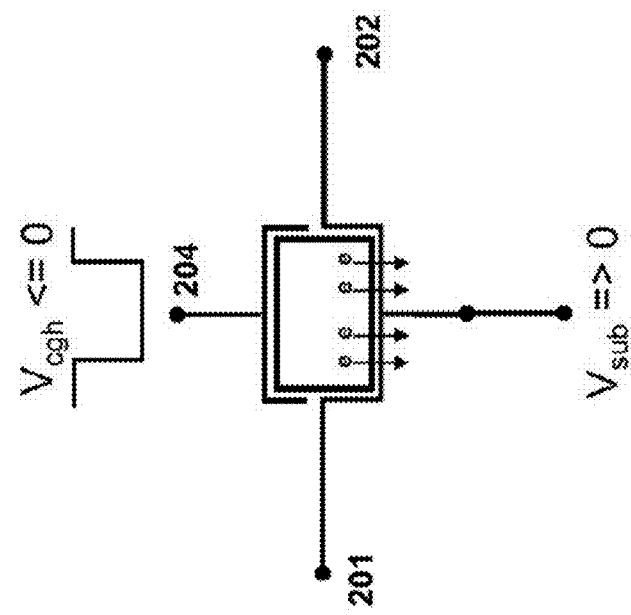
Figure 6:
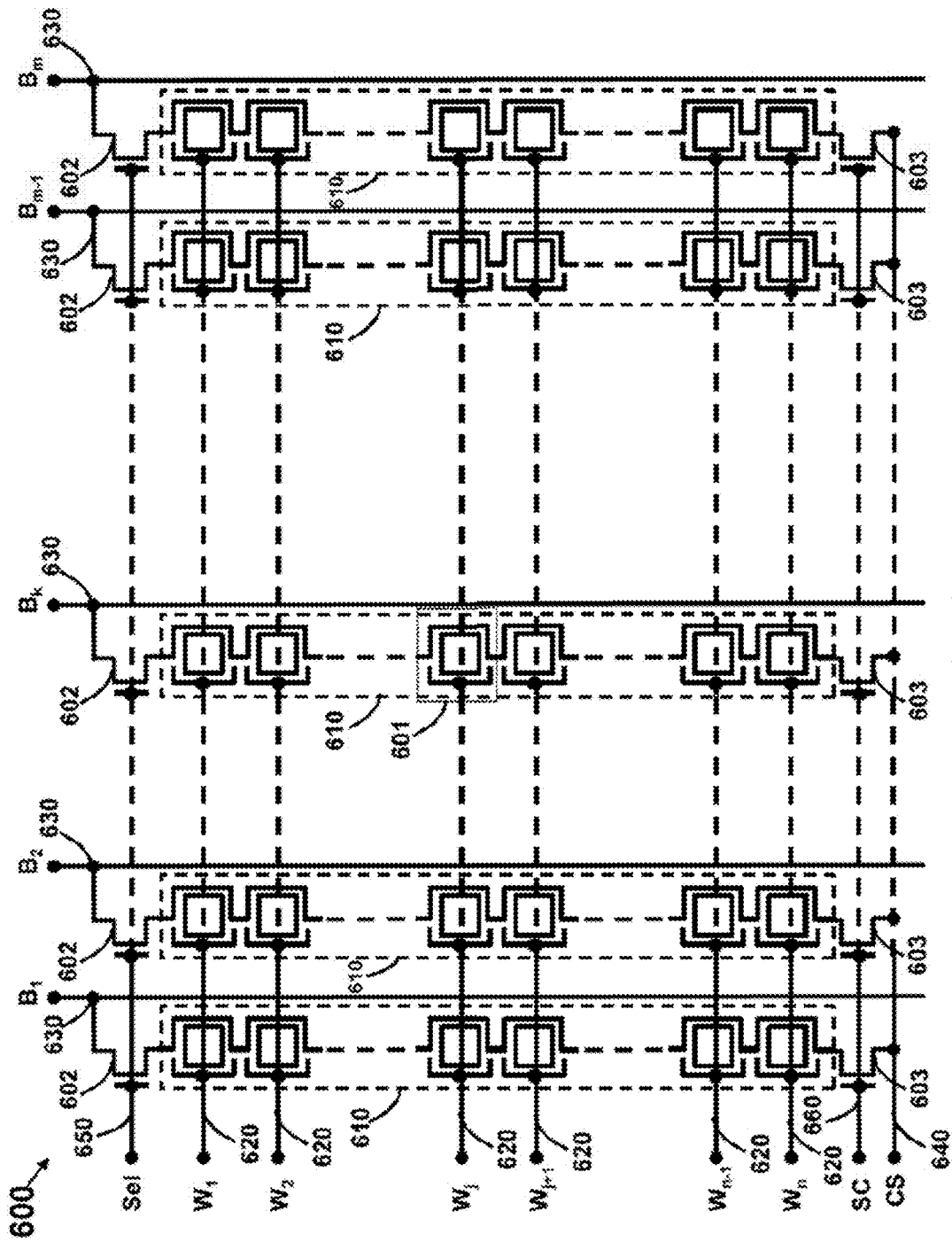
FIG. 6 shows the schematic of the recess channel NVM devices in NAND-type cell array according to one embodiment of the invention.
Figure 7:
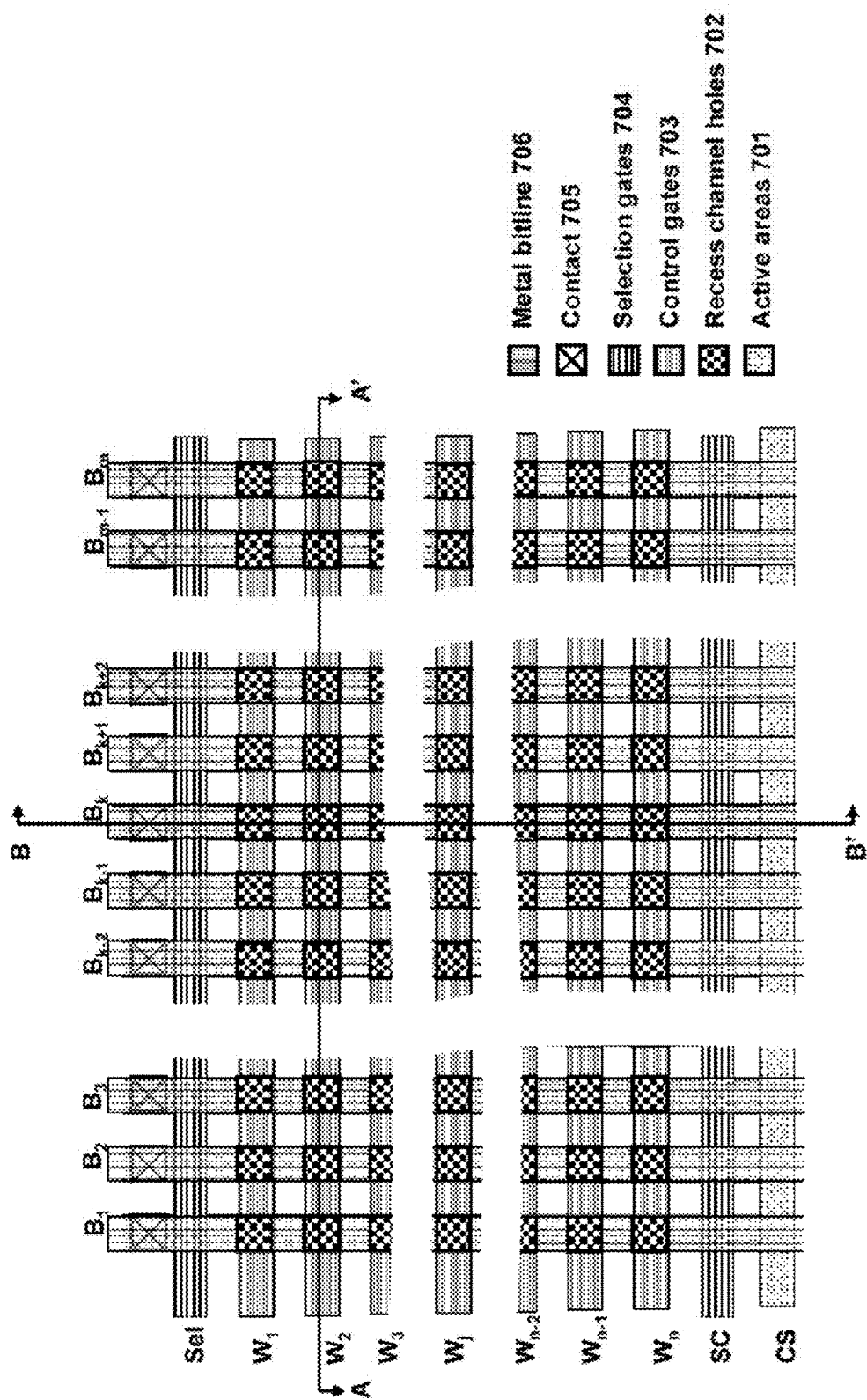
FIG. 7 shows the top view of the recess channel NVM devices in NAND-type cell array of FIG. 6.
Figure 8C:
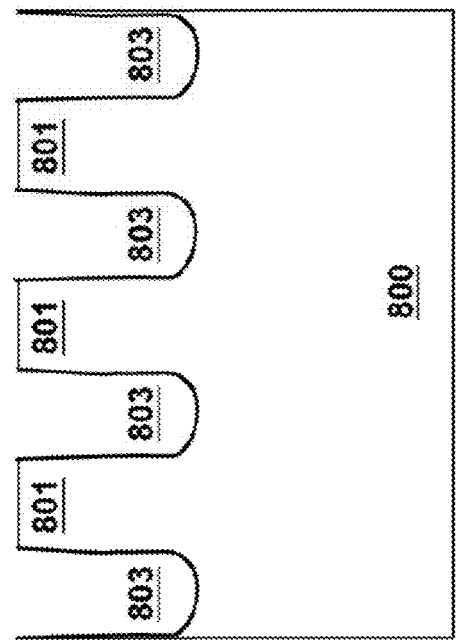
FIGS. 8b and 8c show the cross section views for line AA' and line BB' (as the locations indicated in FIG. 7) after shallow trench isolation process and recess channel hole etch process for NAND-type array of FIG. 6.
Figure 8B:
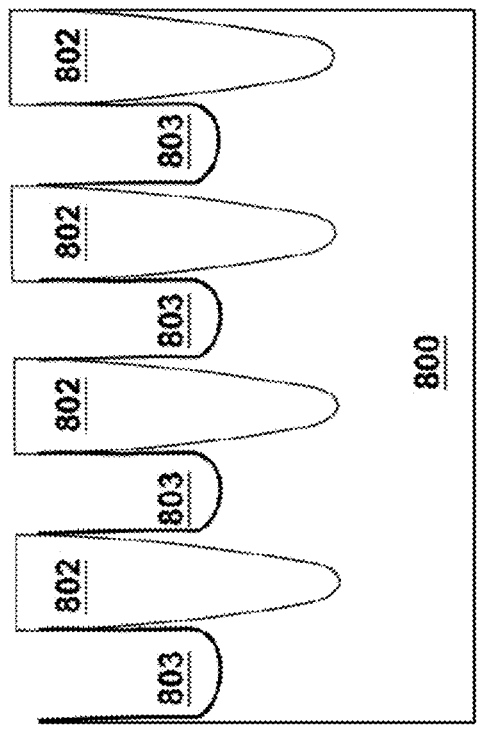

In one embodiment, the recess channel NVM devices 601 form an m×n NAND-type cell array 600 as the schematic shown in FIG. 6. The NAND-type cell array 600 consists of plural NAND strings 610 in FIG. 6. Each NAND string 610 is electrically connected to its correspondent vertical bitline 630 through its bitline selection transistor 602, and to the horizontal common source line CS 640 through its common source transistors 603. The control gates in a row of NVM devices 601 are connected to form a wordline 620 while the gates in a row of bitline selection transistors 602 and the gates in a row of common source transistors 603 are connected to form the bitline selection line (Sel) 650 and the common source selection line (SC) 660, respectively. As shown in FIG. 6, the m×n NAND flash array 600 is configured with n wordlines, m bitlines, one common source line (CS), one bitline selection line (Sel), and one common source selection line (SC). To illustrate the fabrications of the recess channel NVM devices for the NAND flash array 600, the top view of the correspondent NAND flash array for the schematic in FIG. 6 is shown in FIG. 7. The associate processing masks and the correspondent cross section views of AA' and BB' lines accordingly with their process steps are the followings: (1) P-type impurities and N-type impurity for the cell array are implanted into silicon substrate to form the array P-well 800 shown in FIGS. 8b and 8c, and deep N-well (not shown), respectively. (2) Shallow Trench Isolation (STI) process module with an active area mask is performed to separate the active areas 801 from the field isolation oxide areas 802 shown in FIGS. 8b and 8c. (3) The reverse control gate mask 825 in FIG. 8a is applied to etch the recess channel holes by selective Reactive Ion Etch (RIE) process. The selective RIE process etches the exposed silicon substrate areas to form multiple recess channel holes 803 without etching the field oxide areas 802 in the array. The recess channel holes 803 in the cell array after etch process are located at the square patterned areas 702 from the top view of FIG. 7. The widths of the recess channel holes 803 are substantially equal to those of the exposed active areas 801. The recess channel holes 803 are further rounded to prevent sharp silicon corners from creating mechanical stress and high electrical fields. The final cross section views after recess channel hole etch process are shown in FIG. 8b (AA') and FIG. 8c (BB'). (4) A tunneling oxide 910 shown in FIGS. 9b and 9c with a thickness between 60 Å~100 Å (angstrom) is grown on the silicon surfaces along with the recess channel silicon surfaces. A layer of first polysilicon 920 is deposited to fill the recess channel holes by Chemical Vapor Deposition (CVD). The first polysilicon mask 925 covering the NVM cell array active areas (square pattern in strips) as shown in FIG. 9a is applied for blocking the removing of the first polysilicon on the active areas in the cell array during the first polysilicon etch process. Consequently the first polysilicon film covering the field areas in the cell array and the areas outside the cell array are completely removed after the first polysilicon etch process. The resultant cross sections (line AA' and BB') after the first polysilicon etch process are shown in FIGS. 9b and 9c, respectively. (5) The high-k (electrical permittivity) coupling dielectric film stack 1001 consisting of either choice of nitride, aluminum oxide, hafnium oxide, or zirconium oxide, is deposited to a thin oxide liner on top of the first polysilicon 920. A second metal gate material 1002 such as silicided-polysilicon, tungsten-polysilicon, titanium nitride, tantalum nitride, tantalum, or aluminum, is then deposited on top of the coupling dielectric stacks 1001. The control gate mask 1005 shown in FIG. 10a for the self-aligned gate etching process, is applied to etch off the gate material 1002 along with the remaining first polysilicon 920 on the array active areas for the formations of control gates (wordlines) as the cross section views of FIGS. 10b (AA') and 10c (BB'), respectively. In the embodiment, each of the charge storing structure 920 (after the self-aligned gate etching process) has a first portion filling the recess channel hole 803 and a second portion protruding from the substrate surface or the surface of the active area 801 as shown in FIG. 10c. Another mask (not shown) for the MOSFET transistor gates including access transistor gates Sel and SC is applied to etch off the gate material for the formation of the generic transistor gates. (6) The N-type impurities 1100 such as arsenic ions or phosphorus ions are either implanted or diffused into silicon substrate to form the N-type source/drain electrodes 118 as illustrated in FIGS. 11a and 11b. (7) Spacer process module is then applied to form MOSFET spacers. After impurity activation, the device formations in the frontend of fabrication have been completed. The fabrication continues to the backend processes of metallization for wiring connection.

Figure 12:
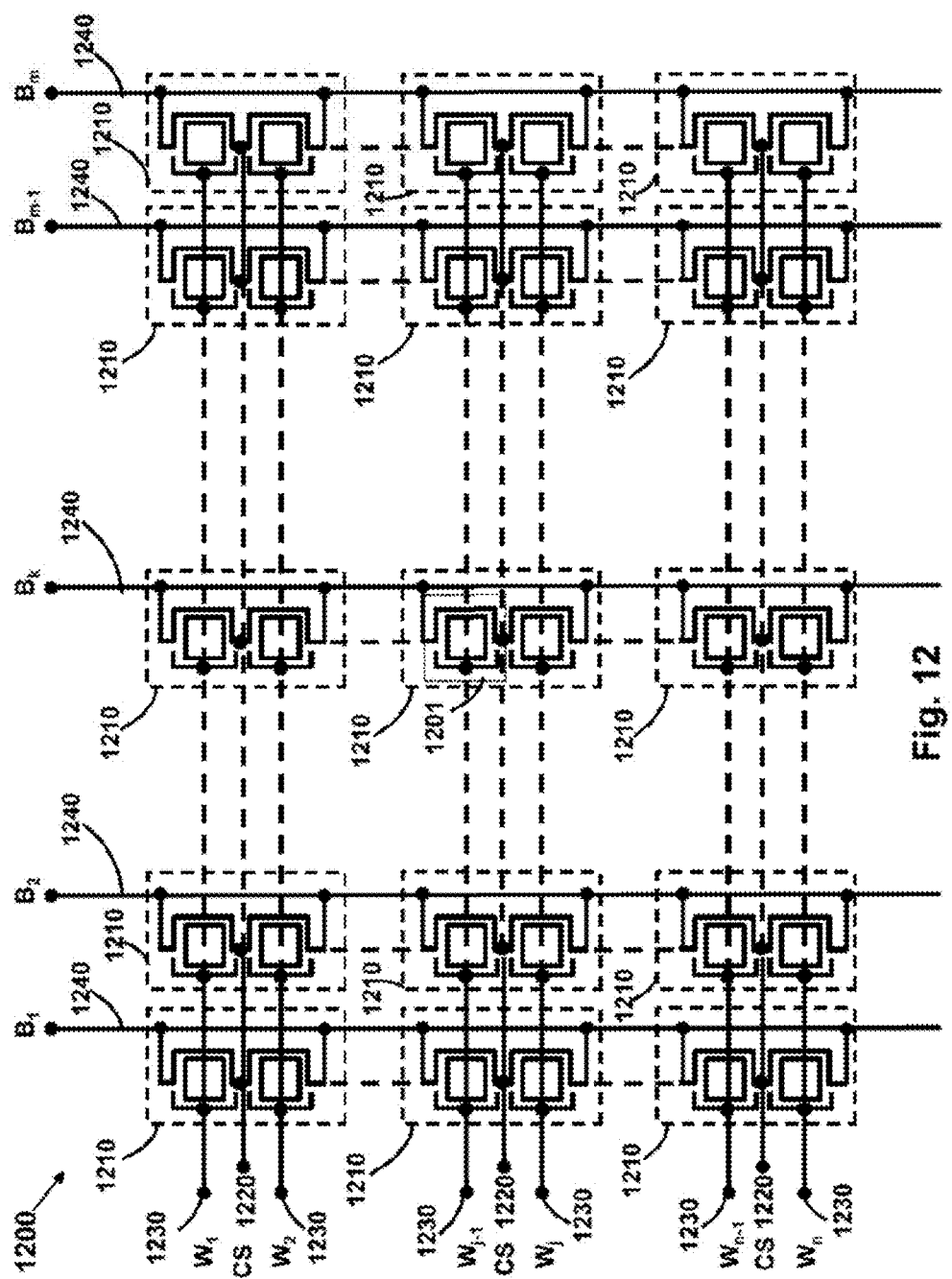
FIG. 12 shows the schematic of the recess channel NVM devices in NOR-type cell array according to another embodiment of the invention.
Figure 13:
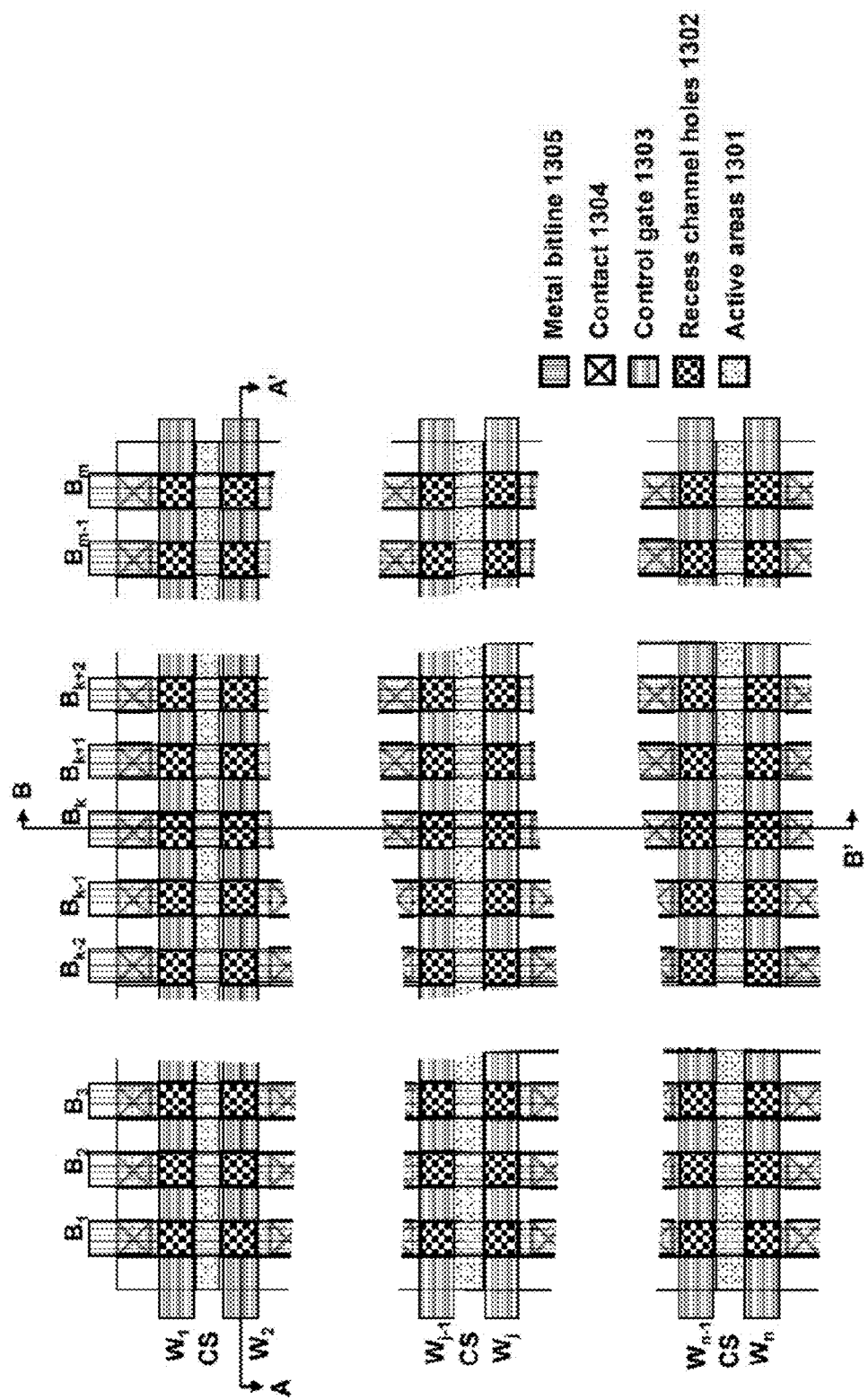
FIG. 13 shows the top view of the recess channel NVM devices in NOR-type cell array of FIG. 12.
Figure 14C:
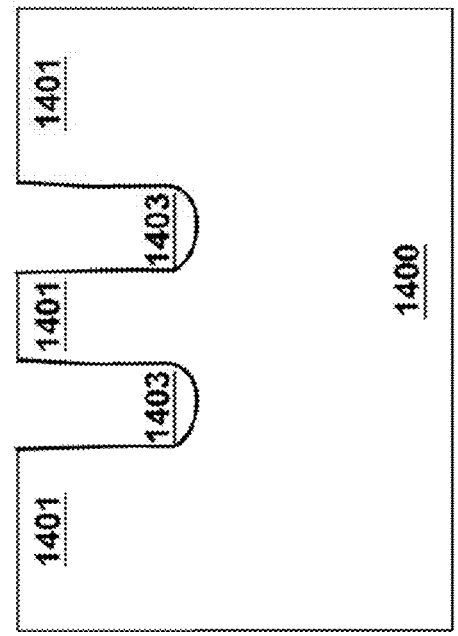
FIGS. 14b and 14c show the cross section views for line AA' and line BB' (as the locations indicated in FIG. 13) after shallow trench isolation process and recess channel hole etch process for NOR-type array of FIG. 12.
Figure 14B:
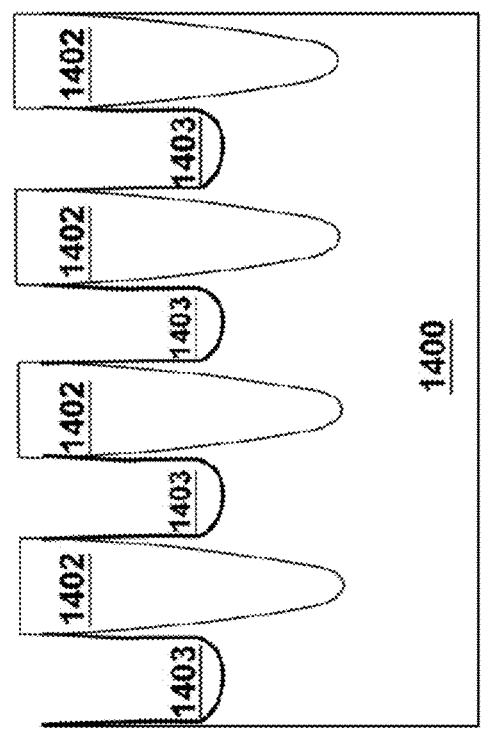
Figure 15A:
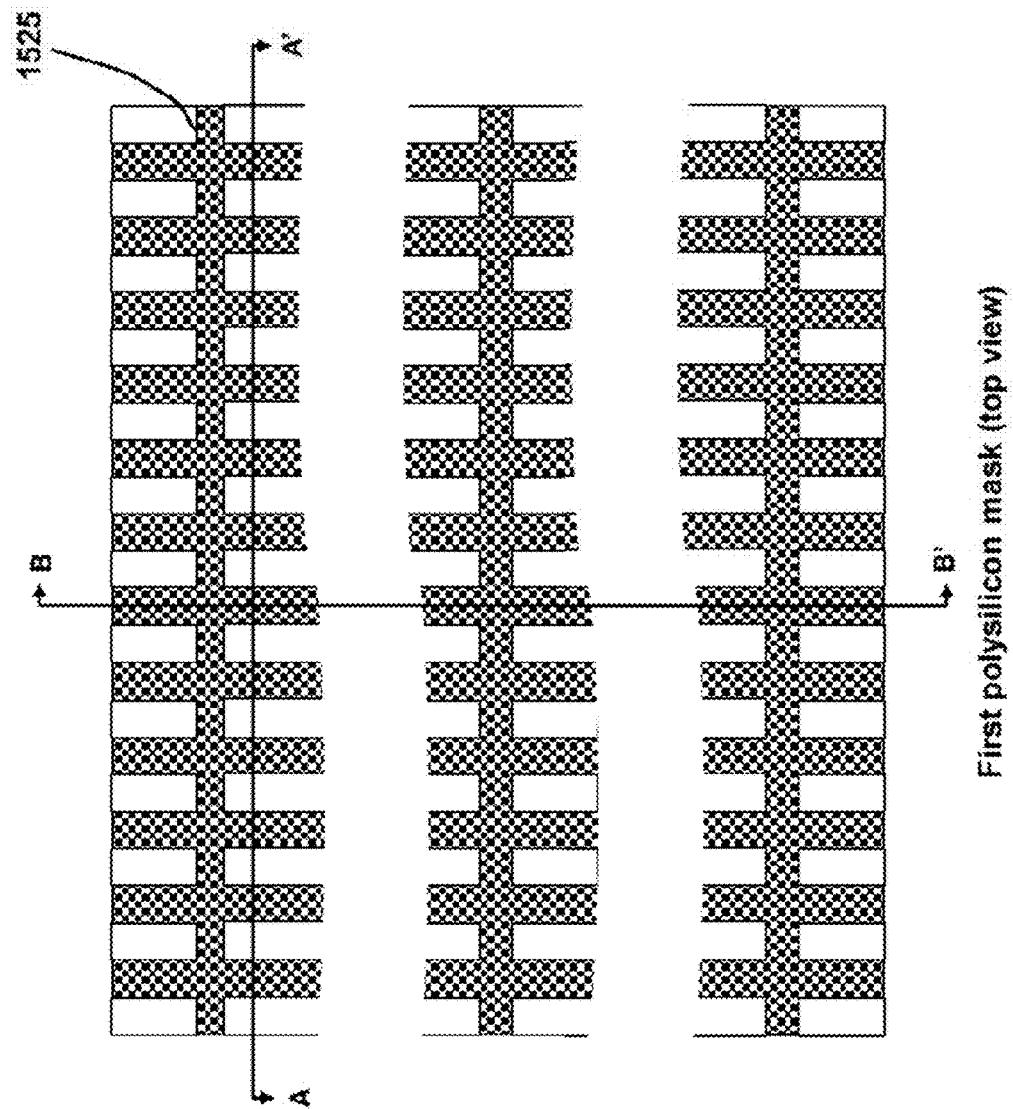
FIG. 15a shows a first polysilicon mask for NOR-type array of FIG. 13.

In another embodiment the recess channel NVM devices form NOR-type cell device array 1200 as the schematic and the correspondent top view shown in FIGS. 12 and 13, respectively. Pluralities of NOR-pair devices 1210 are configured to form NOR-type cell array 1200 in FIG. 12. The shared common source electrodes for a row of the NOR-pair NVM devices 1210 form a common source line 1220. The control gates of the recess channel NVM devices 1210 in a row form a wordline 1230. The drain electrodes of the NVM devices 1210 in a column form a bitline 1240. The m×n NOR-type array 1200 is configured into m-column and n-row recess channel NVM devices with m bitlines 1240, n wordlines 1230, and n/2 common source lines 1220. To illustrate the fabrications of the recess channel NVM devices for the NOR-type array 1200, we show the mask view and the cross section views of AA' and BB' lines in FIG. 13 accordingly with the process steps as the followings: (1) P-type impurities and N-type impurity for the cell array are implanted into silicon substrate to form the array P-well 1400 shown in FIGS. 14b and 14c, and deep N-well (not shown), respectively. (2) Shallow Trench Isolation (STI) process module with an active area mask is performed to separate the active areas 1401 from the field isolation oxide areas 1402 shown in FIGS. 14b and 14c. (3) The reverse control gate mask 1425 in FIG. 14a is applied to etch the recess channel holes 1403 by Reactive Ion Etch (RIE) process. The selective RIE process etches the exposed silicon areas to a depth without etching the field oxide areas 1402. The recess channel holes 1403 in the cell array after the etch process are located at the square patterned areas 1302 from the top view of FIG. 13. The widths of the recess channel holes 1403 are substantially equal to those of the exposed active areas 1401. The recess channel holes 1403 are further rounded to prevent sharp silicon corners from creating mechanical stress and high electrical fields. The cross section views after recess channel hole etch process are shown in FIGS. 14b (AA') and 14c (BB'). (4) A tunneling oxide 1510 shown in FIGS. 15b and 15c with a thickness of around 60 Å~100 Å (angstrom) is grown on the silicon along with the recess channel surfaces. A layer of first polysilicon 1520 is deposited to fill the recess channel holes 1403 by Chemical Vapor Deposition (CVD). The first polysilicon mask 1525 covering the NVM cell array active areas (square pattern) as shown in FIG. 15a is applied for blocking the removing of the polysilicon on the active areas in the cell array during the first poly silicon etch process. Consequently the first polysilicon film covering the field areas in the cell array and the areas outside the cell array are removed during the first polysilicon etch process. The resultant cross sections (line AA' and BB') after the first polysilicon etch process are shown in FIGS. 15b, and 15c, respectively. (5) The high-k (electrical permittivity) coupling dielectric film stack 1601 consisting of either choice of nitride, aluminum oxide, hafnium oxide, or zirconium oxide, is deposited to a thin oxide liner on top of the first polysilicon 1520. Then a second metal gate material 1602 such as silicided-polysilicon, tungsten polysilicon, titanium nitride, tantalum nitride, tantalum, or aluminum, is deposited on top of the coupling dielectric stacks 1601. The control gate mask 1625, shown in FIG. 16a for the self-aligned gate etching process, is applied to etch off the gate material 1602 along with the remaining first polysilicon 1520 on the array active areas for the formations of control gates (wordlines) as the cross section views of FIGS. 16b (AA') and 16c (BB'), respectively. In the embodiment, each of the charge storing structure 1520 has a first portion filling the recess channel hole 1403 and a second portion protruding from the substrate surface or the surface of the active area 1401 as shown in FIG. 16c. Another mask (not shown) for the MOSFET transistor gates is applied to etch off the gate material for the formation of the generic transistor gates. (6) The N-type impurities 1710 such as arsenic ions or phosphorus ions are implanted or diffused into silicon substrate to form the N-type source/drain electrodes 1720 as illustrated in FIGS. 17a and 17b. (7) Spacer process module is applied to form MOSFET spacers. After impurity activation, the device formations in the frontend of fabrication have been completed. The fabrication continues to the backend processes of metallization for wiring connection.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of geometrical shapes including lengths and widths, gate material or tunneling dielectrics will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A non-volatile memory (NVM) device, comprising:
   a substrate having an active region defined by a field isolation structure, the active region having a recess channel hole thereon;
   a tunneling oxide layer on an inner wall of the recess channel hole and a surface of the active region;
   a charge storing structure filling the recess channel hole and formed on the tunneling oxide layer in a portion that is within the recess channel hole;
   a coupling dielectric layer formed on the charge storing structure and the field isolation structure;
   a control gate formed on the coupling dielectric layer; and
   a source region and a drain region at upper portions of the active region adjacent to the charge storing structure,
   wherein threshold voltages of the NVM device are varied by injecting electrical charges into the charge storing structure or by removing the electrical charges from the charge storing structure,
   wherein the NVM device has different threshold voltage states to represent different digital data,
   wherein the charge storing structure retains its digital data when power is off,
   wherein the NVM device is a single-transistor type;
   wherein the charge storing structure is made of one selected from the group consisting of conducting floating gate, charge trap material and nano-particles embedded in oxides;
   wherein when the NVM device is a conducting floating gate NVM device and no charges are stored on the charge storing structure, a floating gate voltage $V_f$ is given by: $V_f = V_{cg} \times C_c/(C_c + C_{mos})$, wherein $C_c$ is a capacitance between the charge storing structure and the control gate, $V_{cg}$ is an applied control gate voltage and $C_{mos}$ is a capacitance between the charge storing structure and its device channel, and
   wherein the charge storing structure has a single width substantially equal to that of the recess channel hole.

2. The NVM device according to claim 1, wherein the tunneling oxide layer has a thickness between 60 Å and 100 Å.

3. The NVM device according to claim 1, wherein the recess channel hole is rounded to prevent sharp silicon corners.

4. The NVM device according to claim 1, wherein the source region and the drain region are located above a device channel of the NVM device, and the device channel of the NVM device is formed along an outer wall of the recess channel hole below the tunneling oxide layer.

5. The NVM device according to claim 1, wherein the field isolation structure comprises at least one shallow trench isolation region.

6. The NVM device according to claim 1, wherein the charge storing structure has a first portion filling the recess channel hole and a second portion protruding from the substrate surface.

7. The NVM device according to claim 1, wherein the recess channel hole has a width substantially equal to that of the active region.

8. A non-volatile memory (NVM) device, comprising:
a substrate having an active region defined by a field isolation structure, the active region having a recess channel hole thereon;
a tunneling oxide layer on an inner wall of the recess channel hole and a surface of the active region;
a charge storing structure filling the recess channel hole and formed on the tunneling oxide layer in a portion that is within the recess channel hole;
a coupling dielectric layer formed on the charge storing structure and the field isolation structure;
a control gate formed on the coupling dielectric layer; and
a source region and a drain region at upper portions of the active region adjacent to the charge storing structure,
wherein threshold voltages of the NVM device are varied by injecting electrical charges into the charge storing structure or by removing the electrical charges from the charge storing structure,
wherein the NVM device has different threshold voltage states to represent different digital data,
wherein the charge storing structure retains its digital data when power is off,
wherein the NVM device is a single-transistor type;
wherein the charge storing structure is made of one selected from the group consisting of conducting floating gate, charge trap material and nano-particles embedded in oxides;
wherein when the NVM device is a conducting floating gate NVM device, a threshold voltage shift from the NVM device's intrinsic threshold voltage is given by: $\Delta V_{th} = -Q/C_c$, wherein Q is an amount of charges on the charge storing structure and $C_c$ is a capacitance between the control gate and the charge storing structure; and
wherein the charge storing structure has a single width substantially equal to that of the recess channel hole.

9. The NVM device according to claim 8, wherein the tunneling oxide layer has a thickness between 60 Å and 100 Å.

10. The NVM device according to claim 8, wherein the recess channel hole is rounded to prevent sharp silicon corners.

11. The NVM device according to claim 8, wherein the source region and the drain region are located above a device channel of the NVM device, and the device channel of the NVM device is formed along an outer wall of the recess channel hole below the tunneling oxide layer.

12. The NVM device according to claim 8, wherein the field isolation structure comprises at least one shallow trench isolation region.

13. The NVM device according to claim 8, wherein the charge storing structure has a first portion filling the recess channel hole and a second portion protruding from the substrate surface.

14. The NVM device according to claim 8, wherein the recess channel hole has a width substantially equal to that of the active region.

\* \* \* \* \*